United States Patent [19]

Basiulis

[11] Patent Number: 4,503,483
[45] Date of Patent: Mar. 5, 1985

[54] HEAT PIPE COOLING MODULE FOR HIGH POWER CIRCUIT BOARDS

[75] Inventor: Algerd Basiulis, Redondo Beach, Calif.

[73] Assignee: Hughes Aircraft Company, El Segundo, Calif.

[21] Appl. No.: 374,118

[22] Filed: May 3, 1982

[51] Int. Cl.³ .............................................. H05K 7/20
[52] U.S. Cl. .............................. 361/385; 165/104.33; 174/15 HP; 357/82
[58] Field of Search .................. 174/15 HP; 361/379, 361/385; 165/104.26, 104.33; 357/82

[56] References Cited

U.S. PATENT DOCUMENTS

| | | | |
|---|---|---|---|
| 3,395,318 | 7/1968 | Laermer et al. | 361/404 |
| 3,411,041 | 11/1968 | Block | 361/381 |
| 3,622,846 | 11/1971 | Relmers | 174/15 HP |
| 3,648,113 | 3/1972 | Rathjen et al. | 361/388 |
| 3,651,865 | 3/1972 | Feldmanis | 165/80 |
| 3,706,010 | 12/1972 | Laermer et al. | 361/382 |
| 4,006,388 | 2/1977 | Bartholomew | 361/383 |
| 4,019,098 | 4/1977 | McCready et al. | 174/15 HP |
| 4,118,756 | 10/1978 | Nelson et al. | 361/385 |
| 4,327,399 | 4/1982 | Sasaki et al. | 361/385 |
| 4,366,526 | 12/1982 | Lijoi et al. | 174/15 HP |

OTHER PUBLICATIONS

K. H. Token et al., "AIAA-80-1511 Heat Pipe Avionic Thermal Control", Jul. 14–16, 1980/Snowmass, Colorado, pp. 1–12.

*Primary Examiner*—A. D. Pellinen
*Assistant Examiner*—Gregory D. Thompson
*Attorney, Agent, or Firm*—Lewis B. Sternfels; W. J. Bethurum; A. W. Karambelas

[57] ABSTRACT

A heat pipe cooling module assembly (20) for cooling electronic components (28) includes a plurality of heat pipe modules (22) comprising condenser and evaporator sections (24, 26) and working fluid therein. In a preferred embodiment, each evaporator section comprises a sandwich construction of a pair of flat outer plates (34), a pair of wick pads (36) and a separator plate (38) comprising channels extending from the evaporator section into the condenser section.

13 Claims, 10 Drawing Figures

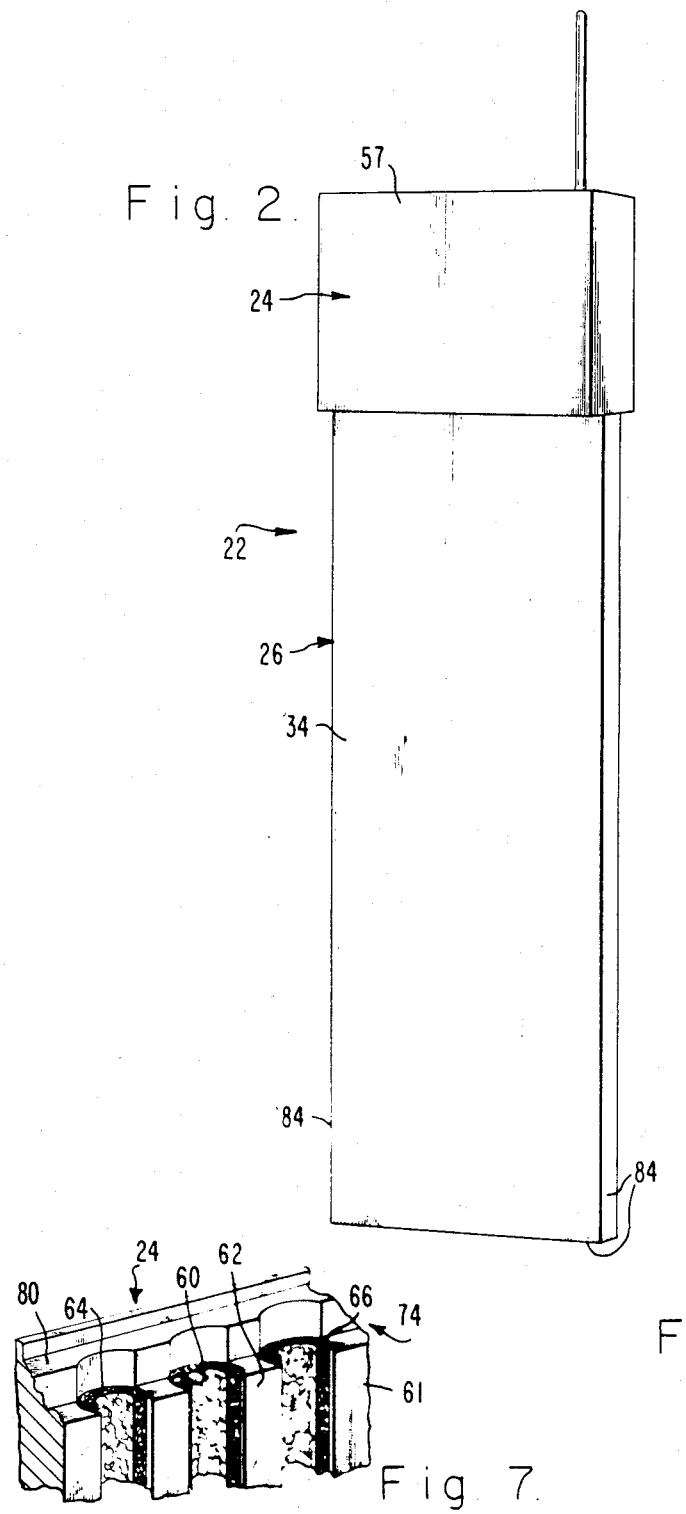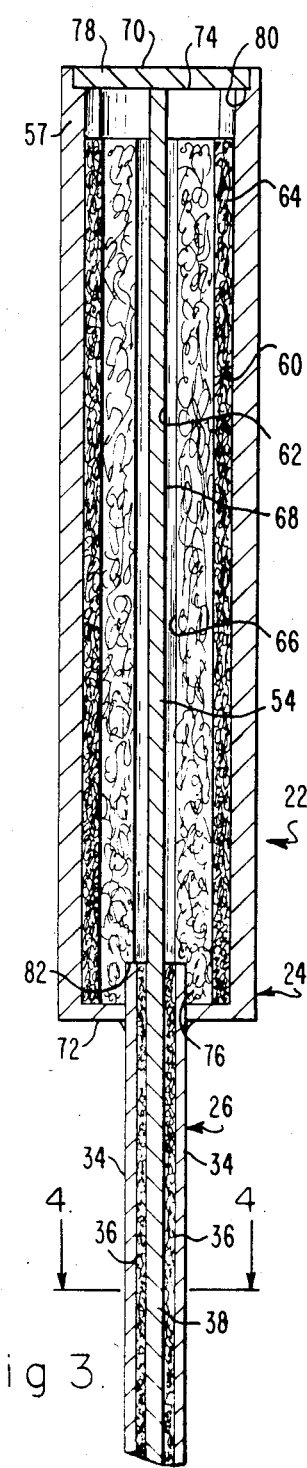

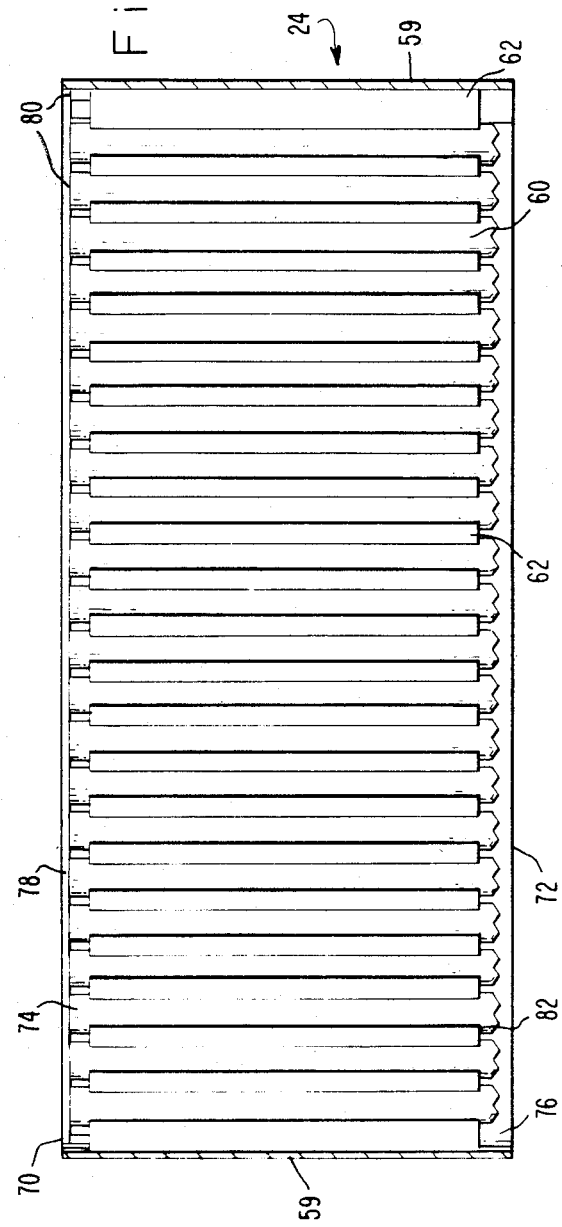
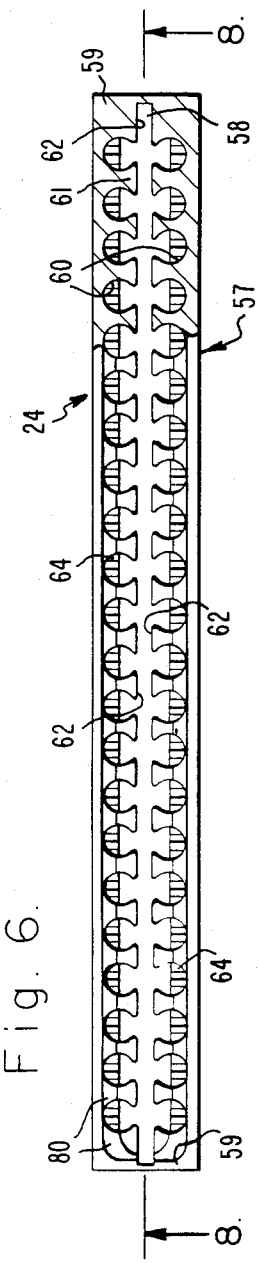

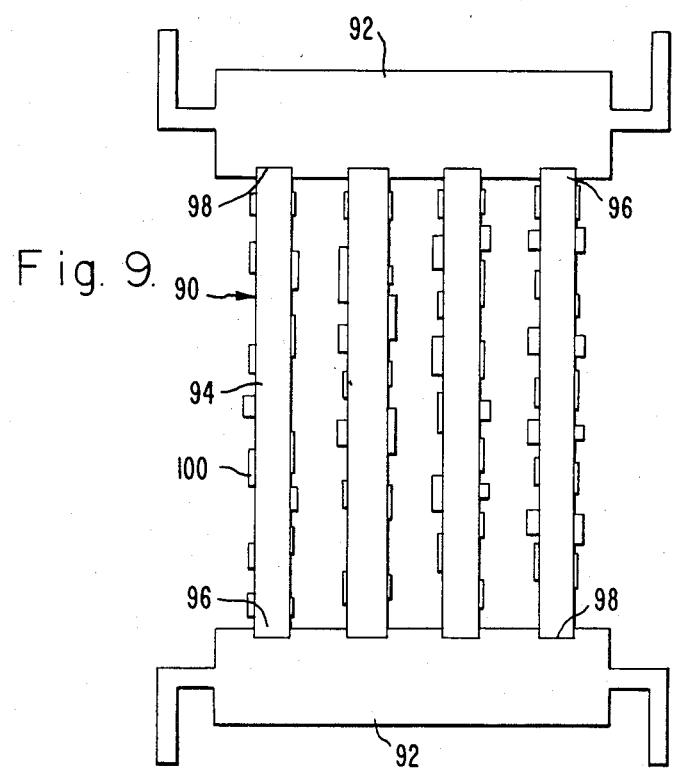

HEAT PIPE COOLING MODULE FOR HIGH POWER CIRCUIT BOARDS

BACKGROUND OF THE INVENTION

1. Field of the Invention

The present invention relates to cooling of electronic components and, in particular, to cooling of high power density electronic components by heat pipe principles in a self-supporting structure.

2. Description of the Prior Art

With ever-increasing density and higher power of electronic components, e.g., in memories and logic arrays in high speed computers, waste heat rejection becomes a limiting factor in such improved computers in the absence of improved heat rejection techniques. In the past, cooling was effected by conduction of heat through a solid conductor, of flowing coolant such as air or freon directly over logic boards or through special paths adjacent thereto, examples being given in U.S. Pat. Nos. 3,411,041, 3,395,318, 3,648,113 and 4,006,388. Heat pipe thermal control has also been used as exemplified by U.S. Pat. Nos. 3,651,865 and 4,118,756. While adequate for thermal control requirements of the past, increased heat loads in new high speed equipment are exceeding the capabilities of the prior art. For example, cooling is needed at least for high power density 1,000 to 2,000 watts logic boards.

In addition, the need both to cool the components and to provide a support therefor did not necessarily result in efficient utilization and combination of the cooling and support structure.

SUMMARY OF THE INVENTION

The present invention is designed to meet and exceed such requirements and to integrate the cooling and supporting structure. It uses heat pipe cooling in a module which is designed to support electronic components. Each module utilizes condenser and evaporator sections in which the evaporator section is configured as a flat plate to which electronic components are directly attached. The condenser sections of a plurality of modules are coupled together and to a heat sink for drawing the heat away from the condenser sections.

Several advantages are derived from this configuration. It enables heat to be withdrawn directly, quickly and efficiently from the components. Individual electronic components or circuit boards of components defining a particular electronic function grouping a plurality of components may be attached directly and on both sides of the evaporator plate section for rapid movement of large quantities of heat therefrom. The evaporation plate section itself resists deforming pressures in order to maintain proper heat flow and evaporation.

Other aims and advantages as well as a more complete understanding of the present invention will appear from the following explanation of exemplary embodiments and the accompanying drawings thereof.

BRIEF DESCRIPTION OF THE DRAWINGS

FIG. 2 is a perspective view of a module shown in FIG. 1;

FIG. 3 is a cross-sectional view of a module of FIG. 2 showing its condenser section and a portion of its evaporator fin section;

FIG. 6 is a top view of an open condenser section;

FIG. 7 is a partial view in perspective of a portion of the condenser section;

FIG. 8 is a view of the condenser section taken along lines 8—8 of FIG. 6;

FIG. 9 is an edge elevational view of a second embodiment of the present invention illustrating a plurality of cooling modules coupled to cooling plenums.

DETAILED DESCRIPTION OF THE INVENTION

Figure 1:
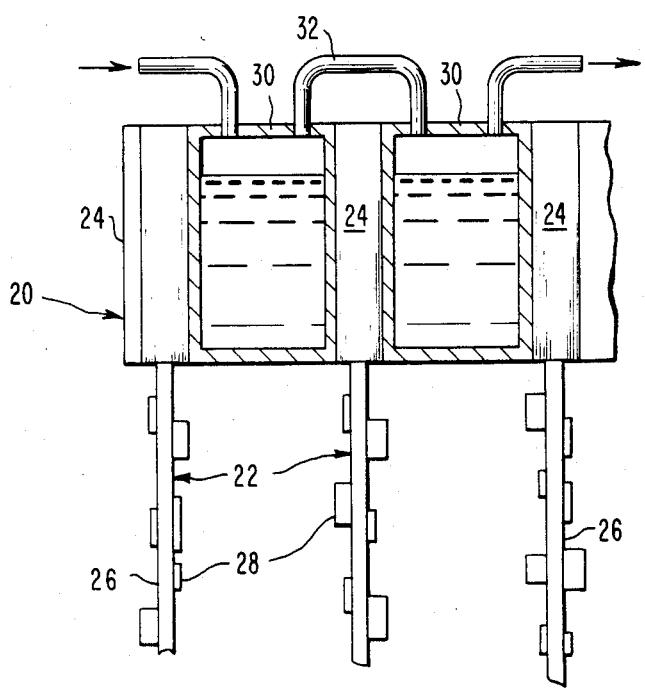
FIG. 1 is an end view in elevation of a plurality of modules coupled together for cooling of electronic components secured to individual module evaporation fins.

As shown in FIG. 1, a heat pipe cooling module assembly 20 comprises a plurality of modules 22, each having a condenser section 24 and an evaporator section 26. Each evaporator section has the appearance of a fin or flat plate. Electronic components 28 are coupled to both sides of evaporator plates of each module and may comprise separate electronic components, or circuit or printed wiring boards or the like which incorporate a plurality of individual components. The condenser sections of the several modules are secured together in any convenient manner to form an assembled structure and to position the evaporator sections in spaced, parallel alignment. A working fluid is sealed within each of the modules so that heat from the electronic components will evaporate the working fluid into a vapor which then moves to the several condenser sections 24. There, the vapor is condensed in to a liquid which then flows through wick material back into the evaporator sections. To remove the heat from the working fluid vapor, any convenient cooling plenum or other cooling means are coupled to condenser section 24. For example, enclosures 30 are placed between condenser sections 24 and coolant fluid is fed between the enclosures by conduit 32. If desired, a plurality of parallel tubes may be sealed to and extend through the condensers. Alternatively, the condenser sections may be abutted together at their sides, and a heat sink be thermally coupled to their top and/or edge surfaces.

Each module may be fabricated from any suitable material, such as copper, stainless steel, aluminum, aluminum oxide and beryllium oxide. Suitable working fluids include water, ammonia, methanol and freon. The particular materials of the module and working fluid are chosen in accordance with the operating temperature requirements in which the module assembly is to be used.

Figure 4:
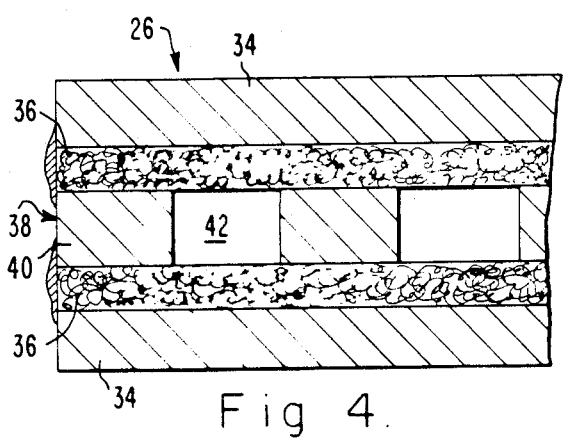
FIG. 4 is a cross-sectional view taken along lines 4—4 of FIG. 3 illustrating the construction of the evaporator section.
Figure 5:
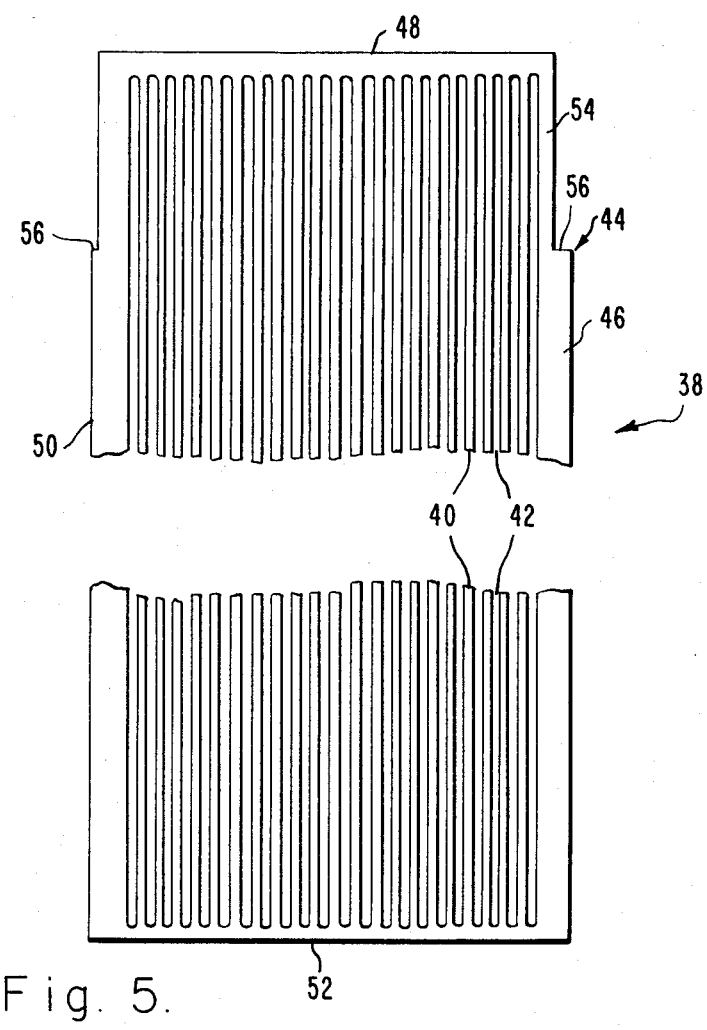
FIG. 5 is a front elevational view of a separator plate placed primarily in the evaporator section.

An individual module and its constituent parts are depicted in FIGS. 2-7, with components of the evaporator section being shown in FIGS. 4 and 5 and the condenser section in FIGS. 6-8. As best shown in FIGS. 2-4, each evaporator section 26 comprises a pair of flat outer plates 34 to which electronic components 28 are secured. A pair of pads 36 comprising wick material, for example, of crushed copper felt, is secured to outer plates 34, and a central separator plate 38 is secured to the wick pads. Thus, outer plates 34, wick pads 36 and separator plate 38 form a sandwich construction which is bonded together in any convenient manner such as by brazing.

To provide for flow of working fluid vapor, separator plate 38 is formed into a channel structure (see also FIG. 5) comprising a plurality of parallel bars 40 which form spaces therebetween comprising parallel slots 42. The bars are held in position by a peripheral enclosure 44 as a rectangular construction of segments 46, 48, 50 and 52, in which the parallel bars and slots extend between opposed segments 48 and 52. In addition, bars 40 provide a solid connection between outer plates 34. This sandwich construction of bars, plates and wick pads, therefore, provides a high resistance to crushing and deformation forces exerted on the evaporator section. As a result, the evaporation function is not disturbed even though such forces are present. As shown in FIG. 3, separator plate 38 is intended to extend from evaporator section 26 and entirely through condenser section 24, with projection 54 (see FIG. 5) of the separator plate defined by width reductions 56 in opposed segments 46 and 50.

As best shown in FIG. 3, outer plates 34 and wick pads 36 extend only slightly into condensor section 24.

As depicted in FIGS. 3 and 6–8, condenser section 24 comprises a casing 57 into which a plurality of spaces 58 and 60 are provided (see FIG. 6), including a central rectangular space 58 and lobe-shaped spaces 60. Central space 58 spans the distance between casing end segments 59. The lobe-shaped spaces are divided by rails 61 and extend from both sides of central space 58. As a result, the central space is bounded by end segments 59 and a plurality of elongated flat surfaces 62 on rails 61 which face one another. It is to be understood, of course, that surfaces 62 need not be perfectly aligned but could be staggered if so desired. Viewing FIGS. 3 and 7, formed on the interior of lobe spaces 60 is trough-shaped wick material 64. As best shown in FIG. 3, wick material 64 is bonded within lobe spaces 60 but terminates at faces 66 short of surfaces 62.

The thickness of separator plate 38 at its projection 54 approximately equals the distance between facing surfaces 62 so that the outer surfaces 68 of separator projection 54 are in contact with and bonded to surfaces 62, but are not in contact with terminal faces 66 of trough-shaped wicks 64.

As illustrated in FIG. 3, at its top 70 and bottom 72, condenser casing 57 is provided with respective openings 74 and 76. Separator projection 54 extends entirely through opening 74 but just short of the upper surfaces of top 70 so that an end cap 78 may be brazed to the opening to seal off the top. A ledge 80 (see also FIG. 7) extends around the periphery of opening 74 onto which end cap 78 rests.

At bottom 72 of condenser casing 57 (FIG. 3), opening 76 permits insertion of evaporator outer plates 34 and wick 36 so that they abut against lower surfaces 82 formed by the bottom surfaces of rails 61 and end segments 59.

The entire assembly may be brazed together to join end cap 78 to condenser casing 57, evaporator section 26 to condenser section 24, and the side and end surfaces of evaporator section 26 denoted by indicium 84 in FIG. 2 between wick pad 36 and respective outer plates 34 and separator plate 38.

The embodiment depicted in FIGS. 1–8 is primarily used when condenser sections 24 are higher than evaporator sections 22 of the respective modules so that vapor of the working fluid will flow upwardly through channel slots 42 from the electronic components and into condenser sections 24 for condensation therein. The condensed working fluid then drips downwardly through wick material 64 and exposed portions of separator projection 54 by a combination of capillary pumping and gravity back to the evaporator where evaporation can again take place.

Figure 10:
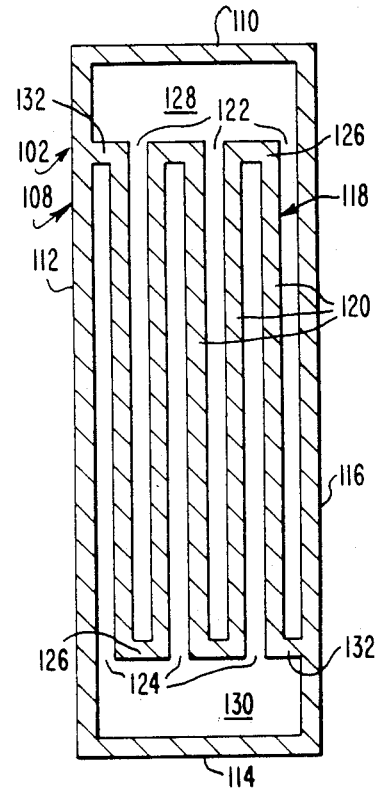
FIG. 10 is a side view of the vapor flow separator plate used in the module illustrated in FIG. 9.

For such uses where the modules may not be stationary with respect to gravity, such as in airborne installations, the embodiment depicted in FIGS. 9 and 10 may be used. As shown in FIG. 9, a plurality of modules 90 are coupled at both ends to a pair of plenums 92 through which a coolant flows. Each module 90 is a sealed unit including a central evaporator section 94 and a pair of condenser sections 96 at opposed ends. Condenser sections 96 fit within slots 98 formed within plenums 92 so that there is a thermal coupling between the modules and the plenum, as well as a means for supporting the modules and the plenums. Such a construction also permits the modules to be slipped in and out of slots 98 for insertion and removal from the plenums. A plurality of electronic components 100 are thermally coupled to the evaporator sections of the respective modules.

Each module 90 comprises a central separator plate 102 (see FIG. 10) with wick pads on its side surfaces and evaporator plates on the outside of the wick pads to form a sandwich construction thereof in the same manner as depicted in FIG. 4 and similar to that shown for evaporator section 26 of FIG. 3. The entire assembly may be brazed together at its outer surfaces to seal a working fluid within the module.

Separator plate 102 comprises a peripheral enclosure 108 comprising segments 110, 112, 114 and 116. Within the interior of enclosure 108 is a serpentine construction 118 with portions thereof comprising parallel bars 120 and alternating slots 122 and 124 extending between opposed segments 110 and 114. Parallel bars 120 terminate at ends 126 which are spaced from peripheral enclosure 108 to provide opposed openings 128 and 130. Thus, parallel slots 122 form vapor flow passages to space 128 within a condenser section 96. Likewise, parallel slots 124 form vapor flow passages to opposed condenser space 130 and the condenser section at the opposite end of the module. Connecting pieces 132 connect outer bars 120 of serpentine construction 118 to opposed enclosure segments 112 and 116. In a manner similar to that of FIGS. 1–8, bars 120 resist crushing forces on the evaporator section to prevent the heat pipe from being deformed.

In the operation of the embodiment depicted in FIGS. 9 and 10, it therefore does not matter whether one or the other of the condenser sections of modules 90 are above or below the central evaporator sections 94, since there will always be an upper condenser section with respect to its evaporator section.

Although the invention has been described with reference to particular embodiments thereof, it should be realized that various changes and modifications may be made therein without departing from the spirit and scope of the invention.

What is claimed is:

1. A heat pipe cooling module which cools electronic components and which includes condenser and evaporator sections and a working fluid therein, said evaporator section comprising a sandwich construction of a pair of flat outer plates to which the electronic components are to be thermally coupled, at least one wick pad adjacent one of said outer plates, and a plurality of spaced bars between said wick pad and the other of said outer plates and extending from said evaporator to said condenser sections to define structural support between said plates for resisting any deformation forces exerted thereon and from consequent decreased heat flow therein and to define a plurality of independent vapor flow channels to said condenser section.

2. A module according to claim 1 in which said sandwich construction further includes a second wick pad sandwiched between said spaced bars and said other outer plate, and means bonding said spaced bars, said wick pads and said outer plates together.

3. A module according to claim 2 in which said spaced bars and channels comprise a flat plate having a plurality of parallel slots therein.

4. A module according to claim 3 in which said slotted flat plate comprises a peripheral enclosure with said bars extending parallelly between opposed segments thereof.

5. A module according to claim 3 in which said slotted flat plate comprises a peripheral enclosure and a serpentine channel separator extending between opposed segments of said enclosure, with portions of said separator comprising said bars in parallel with one another.

6. A module according to claim 5 in which said parallel bars terminate at ends spaced from said peripheral enclosure to provide opposed openings, and said flat outer plates have extenstions extending beyond said bar ends and covering said opposed openings to form pairs of said condenser sections at opposite ends of said evaporator section, with alternating ones of said slots communicating respectively with said condenser section pairs.

7. A heat pipe cooling module assembly which cools electronic components and which includes plurality of modules each comprising a heat pipe having flat evaporator sections and means defining at least one condenser section couple thereto to form said modules into an assembled structure and to position said evaporator sections in spaced and parallel alignment, each of said evaporator sections comprising outer plates to which the electronic components are thermally coupled, at least one wick pad adjacent one of said outer plates, and a plurality of spaced channelling means between said wick pad and another of said outer plates to define both structural support for said plates and a plurality of independent vapor flow paths to said condenser section means.

8. An assembly according to claim 7 further including cooling means coupled to said condenser section means for removing heat therefrom.

9. An assembly according to claim 7 in which each of said evaporator sections is terminated at opposed ends by a pair of said condenser section means, and further including cooling means respectively coupled to said pair of said condenser section means of each of said modules for removing heat from said pair.

10. A heat pipe cooling module assembly which cools electronic components and which includes a plurality of modules each comprising a heat pipe having condenser sections and flat evaporator sections, in which each of said evaporator sections comprises a deformation-resistent construction including a plurality of spaced bars and channels therebetween extending to and defining a plurality of independent vapor flow paths communicating with said condenser sections, a pair of pads of wick material on both sides of said channels, a pair of flat outer plates respectively secured to said wick pads, and means bonding said spaced bars, said wick pads and said outer plates together, said bars providing structural support of said plates for resisting any deformation forces exerted thereon, and means for securing said condenser sections of said modules together to form said modules into an assembled structure and to position said evaporator sections in spaced, parallel alignment, with the electronic components being thermally coupled to said flat evaporator sections.

11. An assembly according to claim 10 in which said bars and channels are formed within a flat plate having a peripheral enclosure and said bars extend parallelly between opposed segments of said enclosure.

12. An assembly according to claim 10 in which said securing means includes means for removing heat from said condenser sections.

13. An assembly according to claim 10 in which each of said evaporator sections is terminated at opposed ends by a pair of said condenser sections, and said securing means includes cooling means respectively coupled to said pair of said condenser section means of each of said modules for removing heat from said pair.

* * * * *